(12) United States Patent
Soma

(10) Patent No.: US 10,998,868 B2
(45) Date of Patent: May 4, 2021

(54) RF SIGNAL GENERATION DEVICE AND RF SIGNAL GENERATION METHOD

(71) Applicant: NEC CORPORATION, Tokyo (JP)

(72) Inventor: Tatsuya Soma, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 16/636,240

(22) PCT Filed: Jun. 4, 2018

(86) PCT No.: PCT/JP2018/021346
§ 371 (c)(1),
(2) Date: Feb. 3, 2020

(87) PCT Pub. No.: WO2019/026412
PCT Pub. Date: Feb. 7, 2019

(65) Prior Publication Data
US 2020/0373891 A1     Nov. 26, 2020

(30) Foreign Application Priority Data

Aug. 4, 2017  (JP) .............................. JP2017-151393

(51) Int. Cl.
*H04B 1/04*    (2006.01)
*H03F 3/217*   (2006.01)
(Continued)

(52) U.S. Cl.
CPC .............. *H03F 3/24* (2013.01); *H03M 3/39* (2013.01); *H04B 1/04* (2013.01); *H03F 2200/451* (2013.01); *H04B 2001/045* (2013.01)

(58) Field of Classification Search
CPC ..... H03F 1/02; H03F 1/26; H03F 3/20; H03F 3/217; H03F 3/24; H04L 27/00; H04B 1/04; H04B 1/0475; H04B 2001/0408
See application file for complete search history.

(56) References Cited

U.S. PATENT DOCUMENTS 9,166,539 B2 * 10/2015 Hori ...................... H03F 3/245
2004/0036530 A1 * 2/2004 Matsuura .............. H03F 1/0222
330/10

(Continued)

FOREIGN PATENT DOCUMENTS

JP     2005117431 A    4/2005
JP     5360232 B2     12/2013
(Continued)

OTHER PUBLICATIONS

Antoine Frappé et al., "An All-Digital RF Signal Generator Using High-Speed ΔΣ Modulators", IEEE Journal of Solid-State Circuits, Oct. 2009, pp. 2722-2732, vol. 44, No. 10.
(Continued)

*Primary Examiner* — Blane J Jackson

(57) ABSTRACT

An RF signal generation device includes an RF signal generation unit 102 that pulse-modulates a prescribed signal to generate an output signal in which four or more-level discrete output levels appear and that a lowest level and any other level appear alternately; a code converter 91 that converts the output signal from the RF signal generation unit 102 into an RF signal in which a smaller number of levels than the number of levels in the output signal; a driver unit 203 that converts the RF signal from the code converter 91 into a binary signal comprising plural bits in which bits corresponding to signal levels in the RF signal are significant; and a digital amplifier 303 that outputs a voltage corresponding to levels in the RF signal outputted from the code converter 91, on the basis of an output signal from the driver unit 203.

17 Claims, 20 Drawing Sheets

(51) Int. Cl.
H03F 3/24 (2006.01)
H03M 3/00 (2006.01)

(56) References Cited

U.S. PATENT DOCUMENTS

2007/0123184 A1* 5/2007 Nesimoglu ............... H03F 1/02
                                                                455/127.1
2012/0257670 A1* 10/2012 Nagatani ............... H04L 27/361
                                                                375/238
2012/0262214 A1   10/2012 Hori
2013/0016795 A1*  1/2013 Kunihiro ................. H03F 3/24
                                                                375/295
2014/0218104 A1   8/2014 Kunihiro

FOREIGN PATENT DOCUMENTS

| JP | 2013254994 A | 12/2013 |
| JP | 201433404 A | 2/2014 |
| WO | 2011/078120 A1 | 6/2011 |
| WO | 2013/042754 A1 | 3/2013 |
| WO | 2013035523 A1 | 3/2013 |

OTHER PUBLICATIONS

Takashi Maehata et al., "High ACLR 1-bit Direct Radio Frequency Converter Using Symmetric Waveform", Proceedings of the 42nd European Microwave Conference, Oct. 29-Nov. 1, 2012, pp. 1051-1054, Amsterdam, The Netherlands.
International Search Report for PCT/JP2018/021346 dated, Aug. 28, 2018.
Communication dated Oct. 27, 2020, from the Japanese Patent Office in Application No. 2019-533927.

* cited by examiner

FIG. 3A

| RF SIGNAL INPUT | RF SIGNAL OUTPUT |
|---|---|
| ···) → ( 1 → 0) → (··· | ···) → ( 1 → 0) → (··· |
| ···) → ( 2/3 → 0) → (··· | ···) → ( 1 → 1/3) → (··· |
| ···) → ( 1/3 → 0) → (··· | ···) → ( 1/3 → 0) → (··· |

FIG. 3B

| RF SIGNAL INPUT | RF SIGNAL OUTPUT |
|---|---|
| ···) → ( 0 → 1) → (··· | ···) → ( 0 → 1) → (··· |
| ···) → ( 0 → 2/3) → (··· | ···) → ( 1/3 → 1) → (··· |
| ···) → ( 0 → 1/3) → (··· | ···) → ( 0 → 1/3) → (··· |

FIG. 5

| OUTPUT OF CODE CONVERTER | A | B | C |
|---|---|---|---|
| 1 | Low | Low | High |
| 1/3 | Low | High | Low |
| 0 | High | Low | Low |

FIG. 7A

| RF SIGNAL INPUT | RF SIGNAL OUTPUT |
|---|---|
| ···) → ( 1 → 0) → (··· | ···) → ( 1 → 0) → (··· |
| ···) → ( 4/5 → 0) → (··· | ···) → ( 4/5 → 0) → (··· |
| ···) → ( 1/2 → 0) → (··· | ···) → ( 1/2 → 0) → (··· |
| ···) → ( 1/5 → 0) → (··· | ···) → ( 1 → 4/5) → (··· |

FIG. 7B

| RF SIGNAL INPUT | RF SIGNAL OUTPUT |
|---|---|
| ···) → ( 0 → 1) → (··· | ···) → ( 0 → 1) → (··· |
| ···) → ( 0 → 4/5) → (··· | ···) → ( 0 → 4/5) → (··· |
| ···) → ( 0 → 1/2) → (··· | ···) → ( 0 → 1/2) → (··· |
| ···) → ( 0 → 1/5) → (··· | ···) → ( 4/5 → 1) → (··· |

FIG. 8

| OUTPUT OF CODE CONVERTER | A | B | C | D |
|---|---|---|---|---|
| 1 | Low | Low | Low | High |
| 4/5 | Low | Low | High | Low |
| 1/2 | Low | High | Low | Low |
| 0 | High | Low | Low | Low |

FIG. 10

| RF SIGNAL INPUT | RF SIGNAL OUTPUT |
|---|---|
| ···) → ( 1 → 0) → (··· | ···) → ( 1 → 0) → (··· |
| ···) → ( 4/6 → 0) → (··· | ···) → ( 4/6 → 0) → (··· |
| ···) → ( 3/6 → 0) → (··· | ···) → ( 3/6 → 0) → (··· |
| ···) → ( 1/6 → 0) → (··· | ···) → ( 4/6 → 3/6) → (··· |

FIG. 11

| OUTPUT OF CODE CONVERTER | A | B | C | D |
|---|---|---|---|---|
| 1 | Low | Low | Low | High |
| 4/6 | Low | Low | High | Low |
| 3/6 | Low | High | Low | Low |
| 0 | High | Low | Low | Low |

FIG. 13

| RF SIGNAL INPUT | RF SIGNAL OUTPUT |
|---|---|
| $\cdots) \rightarrow ( 1 \rightarrow 0 ) \rightarrow (\cdots$ | $\cdots) \rightarrow ( 1 \rightarrow 0 ) \rightarrow (\cdots$ |
| $\cdots) \rightarrow ( 4/5 \rightarrow 0 ) \rightarrow (\cdots$ | $\cdots) \rightarrow ( 1 \rightarrow 1/5 ) \rightarrow (\cdots$ |
| $\cdots) \rightarrow ( 3/5 \rightarrow 0 ) \rightarrow (\cdots$ | $\cdots) \rightarrow ( 1 \rightarrow 2/5 ) \rightarrow (\cdots$ |
| $\cdots) \rightarrow ( 2/5 \rightarrow 0 ) \rightarrow (\cdots$ | $\cdots) \rightarrow ( 2/5 \rightarrow 0 ) \rightarrow (\cdots$ |
| $\cdots) \rightarrow ( 1/5 \rightarrow 0 ) \rightarrow (\cdots$ | $\cdots) \rightarrow ( 1/5 \rightarrow 0 ) \rightarrow (\cdots$ |

FIG. 14

| OUTPUT OF CODE CONVERTER | A | B | C | D |
|---|---|---|---|---|
| 1 | Low | Low | Low | High |
| 2/5 | Low | Low | High | Low |
| 1/5 | Low | High | Low | Low |
| 0 | High | Low | Low | Low |

FIG. 24

| OUTPUT OF MULTIPLIER | A | B | C | D |
|---|---|---|---|---|
| 1 | Low | Low | Low | High |
| 2/3 | Low | Low | High | Low |
| 1/3 | Low | High | Low | Low |
| 0 | High | Low | Low | Low | though, in practice,
RF SIGNAL GENERATION DEVICE AND RF SIGNAL GENERATION METHOD

CROSS REFERENCE TO RELATED APPLICATIONS

This application is a National Stage of International Application No. PCT/JP2018/021346 filed Jun. 4, 2018, claiming priority based on Japanese Patent Application No. 2017-151393, filed Aug. 4, 2017.

TECHNICAL FIELD

The present invention relates to an RF signal generation device that uses a switching amplifier to amplify a desired frequency signal included in a digital signal.

BACKGROUND ART

It is preferable for a transmitter in a base station of a radio system or the like to operate with low power consumption. In particular, a signal amplifier in the final stage of the transmitter consumes 50% or more of the electric power spent by the entire transmitter. It is thus required to increase the power efficiency of the final-stage signal amplifier. A class-D amplifier is known to have high power efficiency. An amplifier circuit is also known that is configured to generate a digital signal to be input to the class-D amplifier by a delta-sigma modulator. In a high frequency band (up to several GHz) as used in radio communication as well, there is a digital transmitter based on a digital amplification scheme that combines the delta-sigma modulator and the class-D amplifier.

Delta-sigma modulation schemes used in a digital transmitter include envelope delta-sigma modulation, low-pass delta-sigma modulation, and band-pass delta-sigma modulation. Configurations of these modulation schemes are disclosed in Patent Literature (PTL) 1, Non Patent Literature (NPL) 1, and NPL 2.

FIG. 21 is a block diagram showing a configuration of a radio transmitter which uses an envelope delta-sigma modulator described in PTL 1. The radio transmitter shown in FIG. 21 includes a radio frequency (RF) signal generation unit 101 including a binary delta-sigma modulator (binary ΔΣ modulator) 21, a driver unit 201, a class-D amplifier 301, and a filter circuit 8.

In the RF signal generation unit 101, a digital baseband unit 1 converts a signal to be transmitted into a baseband signal. The digital baseband unit 1 separates an amplitude component and a phase component of the radio signal to be transmitted, and outputs the components. A pulse phase signal generator 3 converts the phase component (phase signal) into a binary pulse phase signal unconverted to a carrier frequency band. The binary delta-sigma modulator 21 performs delta-sigma modulation on the amplitude component (amplitude signal), using the pulse phase signal as a clock signal, to quantize the signal to a binary pulse amplitude signal. A multiplier 4 multiplies the pulse phase signal by the pulse amplitude signal to generate an RF signal.

In the driver unit 201, a decoder 51 including an inverter circuit Ma converts the RF signal into a differential signal. Driver amplifiers 6a and 6b amplify the differential signal so as to be suitable for driving the class-D amplifier 301 in the subsequent stage.

In the class-D amplifier 301, switch elements 7a and 7b are driven by the differential signal. An RF signal amplified to a desired strength is output from the class-D amplifier 301. Then, an amplified input signal is reconstructed by the filter circuit 8.

FIG. 22 is a block diagram showing an exemplary configuration of a known delta-sigma modulator. In the delta-sigma modulator, a subtractor 211 outputs a difference between an analog input signal and an output signal from a delay circuit 214. An integrator 212 integrates the output signal from the subtractor 211. A comparator 213 compares the signal output from the integrator 212 with a reference voltage to thereby digitize the signal. The digitized signal becomes an output signal from the delta-sigma modulator, and it is also input to the delay circuit 214. The delay circuit 214 delays the input signal and supplies the resultant signal to the subtractor 211. The number of levels of the output signal from the delta-sigma modulator and the values of the respective levels are determined depending on how the threshold voltage in the comparator 213 is set.

In the case of using a delta-sigma modulation scheme, quantization noise is added to a signal during modulation. The quantization noise causes deterioration of signal-to-noise power ratio (SNR). Ideally, all the quantization noise will be removed by a frequency filter. However, in practice, quantization noise as small as possible is desirable at the time of being input to the frequency filter. A method of reducing the quantization noise is described, for example, in PTL 1 (see FIG. 12 and others in PTL 1). With the method described in PTL 1, a signal of multiple values exceeding two is output from the comparator 213 in the delta-sigma modulator.

The RF signal generation unit having the delta-sigma modulator that outputs a multi-level signal described in PTL 1 is greater in number of possible output levels and higher in resolution as compared to an RF signal generation unit having a binary delta-sigma modulator. Thus, the quantization noise (i.e. difference between the input and output signals) becomes small. Accordingly, the signal-to-noise power ratio of the generated radio signal improves as compared to the signal-to-noise power ratio of the radio signal generated by a digital transmitter using the binary delta-sigma modulator. In general, as the number of kinds of output signal levels is increased using a delta-sigma modulator of a greater number of values, the quantization noise included in an output signal from the RF signal generation circuit becomes smaller.

CITATION LIST

Patent Literature

PTL 1: Japanese Patent No. 5360232

Non Patent Literature

NPL 1: Antoine Frappe, "All-Digital RF Signal Generator Using High-Speed ΔΣ Modulators", IEEE Journal of Solid-State Circuits, Vol. 44, No. 10, pp. 2722-2732, October 2009

NPL 2: T. Maehata, et al., "High ACLR 1-bit Direct Radio Frequency Converter Using Symmetric Waveform", Proc. 42nd European Microwave Conf., pp. 1051-1054, November 2012

SUMMARY OF INVENTION

Technical Problem

A signal used for radio communication has its signal-to-noise ratio strictly restricted as a standard, so as to achieve high frequency use efficiency. In a digital transmitter using a class-D amplifier, quantization noise is a primary cause of emission of noise to the outside of the communication band. The quantization noise is derived from the principle of delta-sigma modulation. A challenge for a digital transmitter is to reduce the noise level in the vicinity of the signal band that cannot be removed by a frequency filter.

As explained above, one of the techniques for reducing quantization noise in a digital transmitter is to improve the output resolution of the transmitter, or, to multi-level a signal. As the resolution is increased more and more, an output waveform increasingly closer to an analog signal can be reproduced. However, increasing the resolution more and more leads to an increasingly complicated configuration of the digital transmitter.

For example, PTL 1 also describes a radio transmitter which includes a three-level delta-sigma modulator. It is here assumed that such a three-level delta-sigma modulator is replaced with a four-level delta-sigma modulator. FIG. 23 is a block diagram showing an exemplary configuration of an RF signal generation circuit which uses a four-level delta-sigma modulator.

The RF signal generation circuit shown in FIG. 23 includes an RF signal generation unit 102 having a four-level delta-sigma modulator (four-level ΔΣ modulator) 22, a driver unit 202 having a decoder 52, a class-D amplifier 302, and a filter circuit 8. The output from the RF signal generation unit 102 is a result of multiplication of an output from the four-level delta-sigma modulator 22 and an output from a pulse phase signal generator 3. The result of multiplication is, for example, an RF signal that takes one of four (1, ⅔, ⅓, 0) values.

FIG. 24 is a diagram illustrating signal conversion by the decoder 52. The decoder 52 has a conversion table indicating signal conversion as shown in FIG. 24, for example. The decoder 52 converts an output signal from the RF signal generation unit 102 into four kinds of control signals (A, B, C, D) in which one attains a high level (High) and the others attain a low level (Low), as shown in FIG. 24. Driver amplifiers 6a, 6b, 6c, and 6d amplify the output from the decoder 52 up to driving voltages of switch elements 7a, 7b, 7c, and 7d included in the class-D amplifier 302 in the subsequent stage. The RF signal amplified by the class-D amplifier 302 is then output. It should be noted that each switch element 7a, 7b, 7c, 7d attains an on state when the control signal is High and an off state when the control signal is Low.

As illustrated in FIG. 23, the use of a multi-level delta-sigma modulator increases the number of switch elements used in the class-D amplifier 302. It also requires addition of accompanying driver and power supply circuits. In order to meet these demands, the difficulty in designing increases. With the increased difficulty in designing, the time and effort required for the design and development increase. At the same time, the complicated circuits and the increased number of components increase the cost.

An object of the present invention is to provide an RF signal generation device and an RF signal generation method capable of amplifying a multi-level digital modulation signal with a digital amplifier of simple configuration.

Solution to Problem

An RF signal generation device according to the present invention includes: an RF signal generation unit that pulse-modulates a prescribed signal to generate an output signal in which four or more-level discrete output levels appear, and a lowest level and any other level appear alternately; a code converter that converts the output signal from the RF signal generation unit into an RF signal in which a smaller number of levels than the number of levels in the output signal; a driver unit that converts the RF signal from the code converter into a binary signal comprising plural bits in which bits corresponding to signal levels in the RF signal are significant; and a digital amplifier that outputs a voltage corresponding to levels in the RF signal outputted from the code converter, on the basis of an output signal from the driver unit.

A radio transmitter according to the present invention includes: the above-described RF signal generation device that generates an RF signal; and an antenna that transmits the generated RF signal.

An RF signal generation method according to the present invention includes: pulse-modulating a prescribed signal to generate an output signal in which four or more-level discrete output levels appear and a lowest level and any other level appear alternately; converting the pulse-modulated signal into an RF signal in which a smaller number of levels than the number of levels in the output signal; converting the RF signal into a binary signal comprising plural bits in which bits corresponding to signal levels in the RF signal are significant; amplifying the binary signal comprising plural bits to a signal having a voltage corresponding to the levels in the RF signal; and passing a desired frequency band out of the signal having the amplified voltage to generate an analog RF signal.

Advantageous Effects of Invention

The present invention enables amplification of a multi-level digital modulation signal with a digital amplifier of simple configuration.

BRIEF DESCRIPTION OF DRAWINGS

FIG. 3A is a diagram illustrating signal conversion by a code converter in the first exemplary embodiment.

FIG. 3B is a diagram illustrating signal conversion by a code converter in the first exemplary embodiment.

FIG. 5 is a diagram illustrating signal conversion by a decoder.

FIG. 7A is a diagram illustrating signal conversion by a code converter.

FIG. 7B is a diagram illustrating signal conversion by a code converter.

FIG. 8 is a diagram illustrating signal conversion by a decoder.

FIG. 10 is a diagram illustrating signal conversion by a code converter.

FIG. 11 is a diagram illustrating signal conversion by a decoder.

FIG. 13 is a diagram illustrating signal conversion by a code converter.

FIG. 14 is a diagram illustrating signal conversion by a decoder.

FIG. 24 is a diagram illustrating signal conversion by a decoder.

DESCRIPTION OF EMBODIMENT

Exemplary embodiments of the present invention will be described below with reference to the drawings.

Exemplary Embodiment 1

Figure 1:
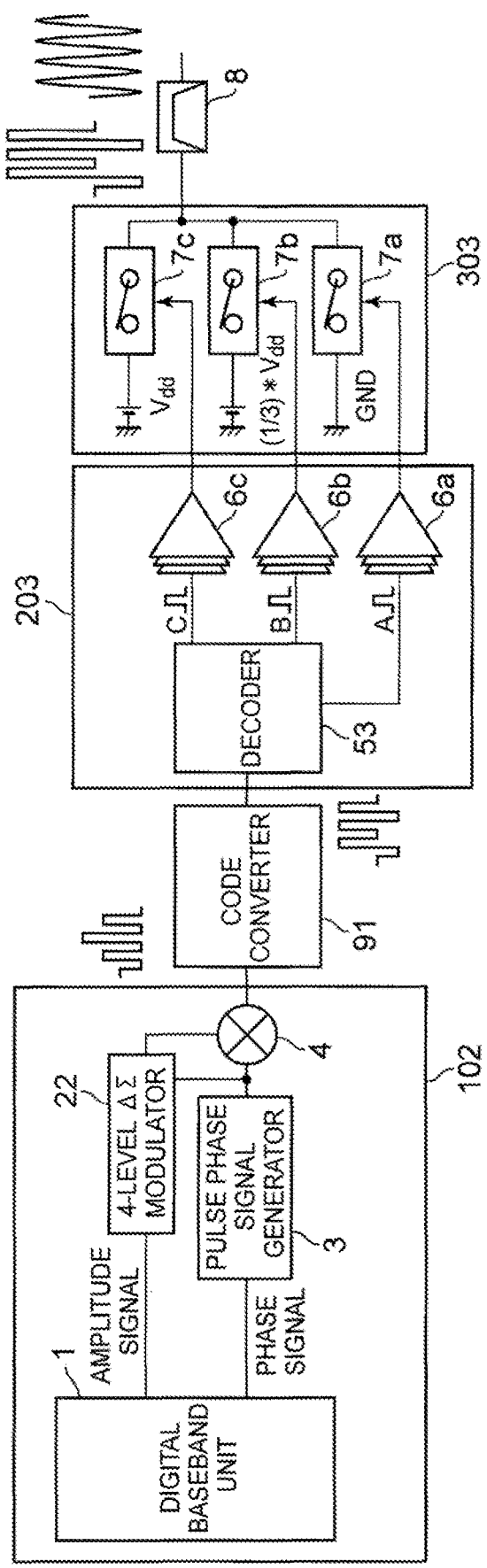
FIG. 1 is a block diagram showing a first exemplary embodiment of an RF signal generation device.

FIG. 1 is a block diagram showing a first exemplary embodiment of an RF signal generation device. The RF signal generation device shown in FIG. 1 includes an RF signal generation unit 102, a code converter 91, a driver unit 203, a class-D amplifier (an example of a digital amplifier) 303, and a filter circuit 8.

The RF signal generation unit 102 includes a digital baseband unit 1, a four-level delta-sigma modulator 22, a pulse phase signal generator 3, and a multiplier 4. The driver unit 203 includes a decoder 53 and driver amplifiers 6a, 6b, and 6c. The class-D amplifier 303 includes switch elements 7a, 7b, and 7c. It should be noted that the switch elements 7a, 7b, and 7c are substantially amplifying elements.

Figure 2:
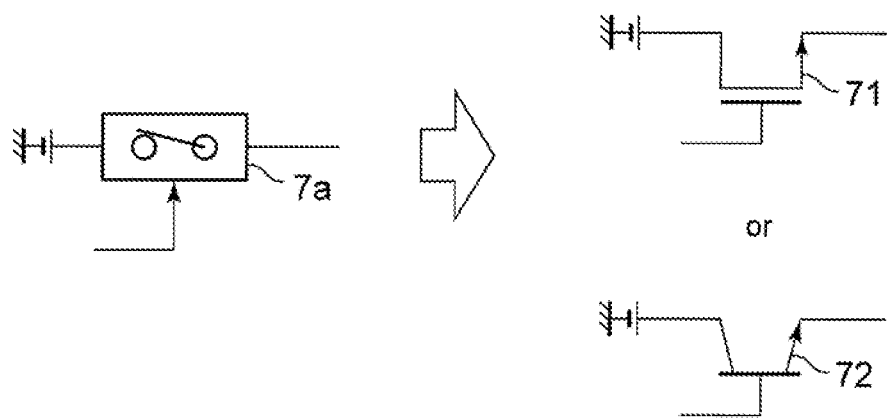
FIG. 2 is a circuit diagram showing an exemplary configuration of a switch element.

FIG. 2 is a circuit diagram showing an exemplary configuration of the switch element 7a. As illustrated in FIG. 2, the switch element 7a is implemented, for example, by a metal oxide semiconductor (MOS) transistor 71 or a bipolar transistor 72. The switch elements 7b and 7c are also implemented by MOS transistors 71, bipolar transistors 72, or the like.

The digital baseband unit 1 outputs an amplitude signal and a phase signal of a radio signal. The pulse phase signal generator 3 converts the phase signal into a binary pulse phase signal upconverted to a carrier frequency band. Specifically, the pulse phase signal generator 3 converts the upconverted phase signal into a pulse phase signal of "1" when the phase signal is a signal corresponding to from 0 to 180 degrees, and converts the phase signal into a pulse phase signal of "0" when the phase signal is a signal corresponding to from 180 to 360 degrees. The pulse phase signal is supplied to a clock terminal of the four-level delta-sigma modulator 22 and to the multiplier 4.

The four-level delta-sigma modulator 22 subjects the amplitude signal to delta-sigma conversion (delta-sigma modulation), using the pulse phase signal as a clock signal, to generate a four-level (1, ⅔, ⅓, 0) digital amplitude signal (multi-level signal).

The multiplier 4 multiplies the pulse phase signal by the digital amplitude signal to generate an RF signal (four-level RF signal) quantized to four values.

The four-level RF signal is characterized in that 0 and any value other than 0, i.e. 1, ⅔, or ⅓, appear alternately.

The four-level RF signal is input to the code converter 91. FIG. 3A and FIG. 3B are diagrams illustrating signal conversion (code conversion) by the code converter 91. The code converter 91 stores data of a conversion table indicating signal conversion as shown in FIG. 3A and FIG. 3B, for example.

The code converter 91 converts the four-level RF signal into a three-level signal, in accordance with the conversion table shown in FIG. 3A and FIG. 3B. With the RF signal having 0 and any other value (1, ⅔, or ⅓) appearing alternately, the code converter 91 accordingly performs the signal conversion by using two consecutive values including 0 as a unit.

The code converter 91 converts a set of the lowest level (0 in the present exemplary embodiment) and another level into a set of other levels, without changing the level difference.

Specifically, as shown in FIG. 3A, when 1 and 0 are input sequentially, the code converter 91 outputs 1 and 0 sequentially. When ⅔ and 0 are input sequentially, the code converter 91 outputs 1 and ⅓ sequentially. When ⅓ and 0 are input sequentially, the code converter 91 outputs ⅓ and 0 sequentially.

It should be noted that the signal may be split in a different manner. That is, as shown in FIG. 3B, the code converter 91 may output 0 and 1 sequentially when 0 and 1 are input sequentially, it may output ⅓ and 1 sequentially when 0 and ⅔ are input sequentially, and it may output 0 and ⅓ sequentially when 0 and ⅓ are input sequentially.

Figure 4:
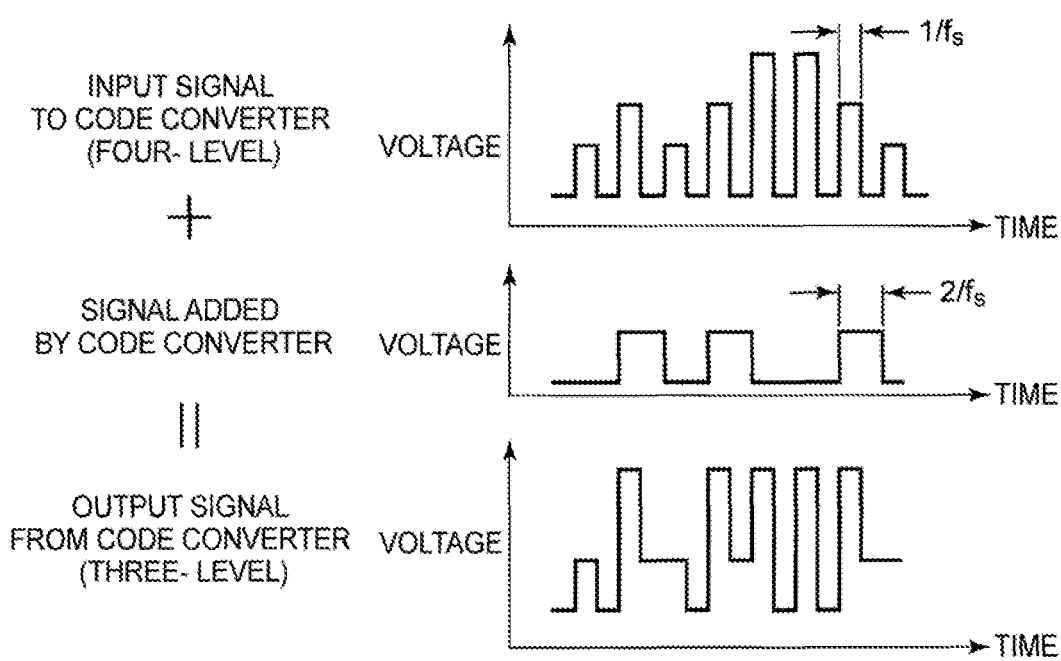
FIG. 4 is a diagram illustrating signal conversion when focusing on addition of a rectangular signal.

Such a conversion is equivalent to adding to the input RF signal a rectangular signal whose bit rate is a half of the bit rate fs of the RF signal. It should be noted that the same applies to the other exemplary embodiments. FIG. 4 is a diagram illustrating signal conversion when focusing on the addition of a rectangular signal. As shown in FIG. 4, the signal output from the code converter 91 is a three-level RF signal.

A digital waveform signal of a certain bit rate is generally known to have no frequency components with integral multiples of that bit rate. Thus, the added signal has no component in the frequency fs where the desired frequency signal exists. Accordingly, the desired frequency component included in the signal is not affected before and after the signal conversion by the code converter 91.

The output signal from the code converter 91 is input to the driver unit 203. The decoder 53 in the driver unit 203 generates controls signals A, B, and C from the three-level input signal.

FIG. 5 is a diagram illustrating signal conversion by the decoder 53. The decoder 53 stores data of a conversion table indicating signal conversion as shown in FIG. 5, for example. The decoder 53 converts the output signal from the RF signal generation unit 102 into three kinds of control signals of (A, B, C) in which one attains High and the others attain Low, as shown in FIG. 5. That is, the decoder 53 converts the output signal from the code converter 91 into a multi-bit binary signal in which one of the bits corresponding to the signal level (1, ⅓, or 0 in the present exemplary embodiment) is significant (High, or, "1" in the present exemplary embodiment).

The control signals A, B, and C are input to the class-D amplifier 303 via the driver amplifiers 6a, 6b, and 6c. When the output value from the code converter 91 is 1, High is input to the switch element 7c connected to $V_{dd}$. When the output value from the code converter 91 is ⅓, High is input to the switch element 7b connected to $V_{dd}/3$. When the output value from the code converter 91 is 0, High is input to the switch element 7a connected to GND. Each switch element 7a, 7b, 7c attains an on state when the control signal is High and an off state when the control signal is Low. With the above processing, the RF signal is amplified, in the class-D amplifier 303, so as to be linear with respect to the output level of the code converter 91. That is, an amplified three-level RF signal is obtained.

The three-level RF signal output from the class-D amplifier 303 is input to the filter circuit 8. The filter circuit 8 passes a signal of desired frequency band out of the RF signal output from the class-D amplifier 303. With this, a desired signal having the desired frequency band amplified is output from the filter circuit 8.

Figure 22:
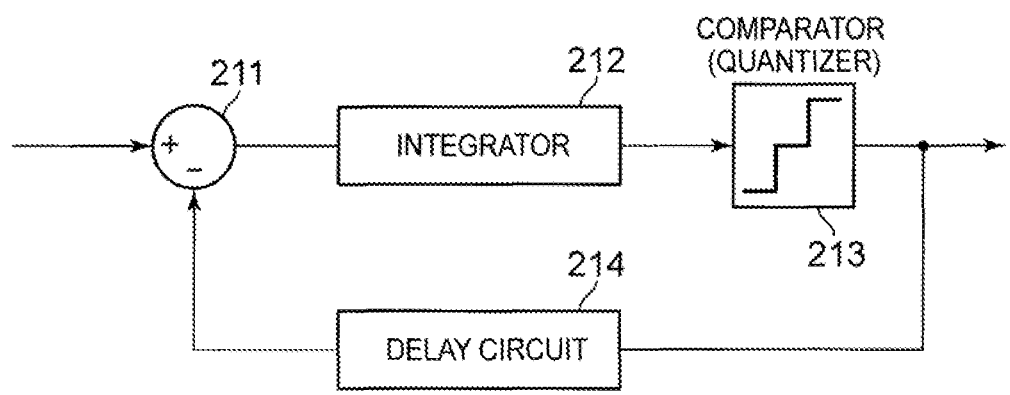
FIG. 22 is a block diagram showing an exemplary configuration of the delta-sigma modulator.

It should be noted that the voltages output from the four-level delta-sigma modulator 22 do not have to be at equal intervals. That is, the comparator (see FIG. 22) in the four-level delta-sigma modulator 22 may have a threshold voltage that is set such that the output from the four-level delta-sigma modulator 22 takes four values of 0, v1, 1–v1, and 1 when the output from the four-level delta-sigma modulator 22 is within the range from 0 to 1. Here, v1 is a value greater than 0 and smaller than 1. In this case, the output voltage from the class-D amplifier 303 takes three values of $V_{dd}$, $V_{dd}*v1$, and 0. The aforesaid output voltages of equal intervals correspond to the voltages when v1 is ⅓.

More generally, the four-level delta-sigma modulator 22 outputs a multi-level signal including, as its output levels, $V_k$, $V_k'$, and $V_k''$ expressed by the following expression, with $V_{min}$ (in the present exemplary embodiment, 0) being the minimum output level.

$$V_k - V_{min} = V_k'' - V_k'$$

In the present exemplary embodiment, $V_k = 1/3$, $V_k'' = 1$, and $V_k' = 2/3$.

Further, the four-level delta-sigma modulator 22 outputs a multi-level signal including, as its output levels, $V_k$ and $V_k'$ expressed by the following expression, with $V_{min}$ (in the present exemplary embodiment, 0) being the minimum output level and $V_{max}$ being the maximum output level (in the present exemplary embodiment, 1).

$$V_k - V_{min} = V_{max} - V_k'$$

In the present exemplary embodiment, $V_k = 1/3$ and $V_k' = 2/3$.

As described above, the code converter 91 adds, to the input four-level RF signal, a signal having no component in the desired frequency band, to thereby obtain a three-level RF signal. Thus, when comparing the input four-level RF signal with the three-level RF signal, there is no change in quantization noise in and around the desired frequency band. Accordingly, the quantization noise included in the three-level RF signal from the code converter 91 becomes smaller than that in an RF signal obtained by the three-level delta-sigma modulator as described in PTL 1. As a result, a radio signal is obtained that has an improved signal-to-noise power ratio than a radio signal generated by a radio transmitter including the three-level delta-sigma modulator described in PTL 1.

Figure 23:
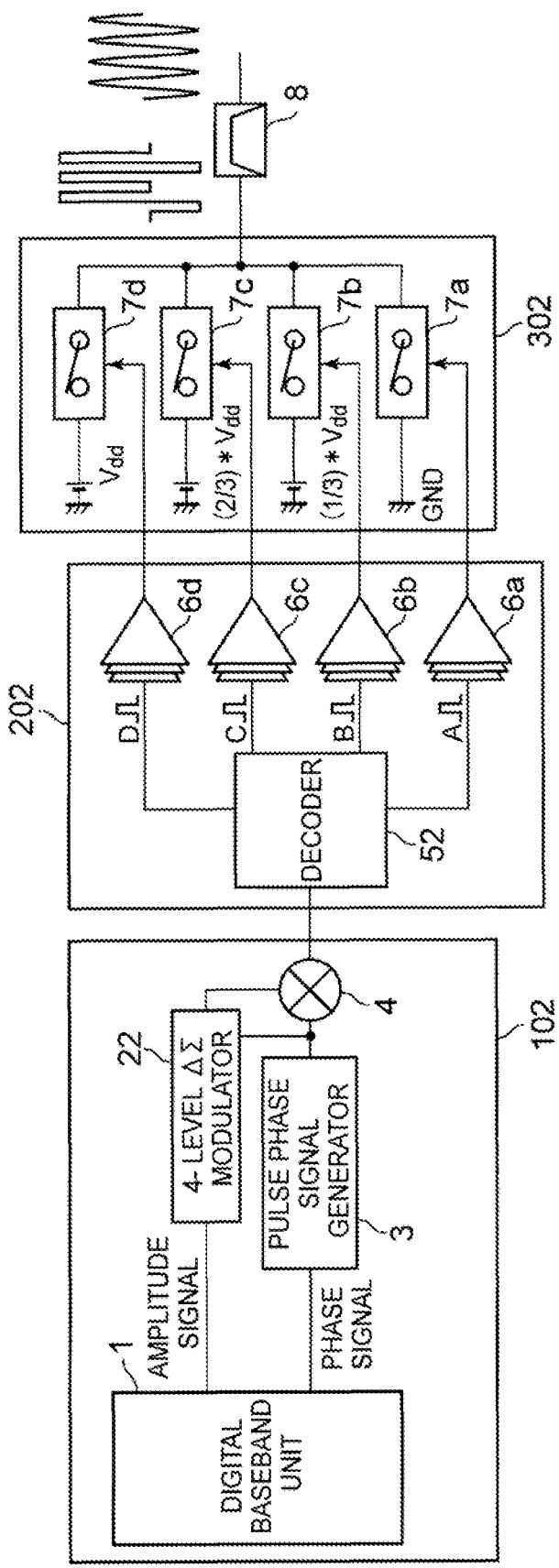
FIG. 23 is a block diagram showing an exemplary configuration of an RF signal generation circuit which uses a four-level delta-sigma modulator.

Further, with the use of the code converter 91, the RF signal generation device is capable of amplifying a multi-level delta-sigma-modulated signal by the class-D amplifier 303 having a smaller number of output values. That is, using the three-level class-D amplifier 303, it is possible to obtain the noise characteristics comparable to those in the case of using a four-level class-D amplifier (see FIG. 23).

In other words, the increase of the cost due to the increased number of switch elements used in the class-D amplifier as well as the addition of accompanying driver and power supply circuits can be suppressed without degradation of the noise characteristics. Further, with the reduction in circuit scale, the time for designing the RF signal generation device and a radio transmitter using the same can be reduced.

Further, when the threshold voltage v1 of the comparator in the four-level delta-sigma modulator 22 is set to a value according to the input modulation wave, the quantization noise is further reduced. For example, when the value of v1 is set to a voltage corresponding to the peak-to-average power ratio (PAPR) of the input signal, the resolution in the vicinity of the voltage value having high occurrence frequency in the input signal is improved as compared to that of the peripheral voltage. As a result, the quantization noise is reduced as seen as the entire input signal.

Exemplary Embodiment 2

Figure 6:
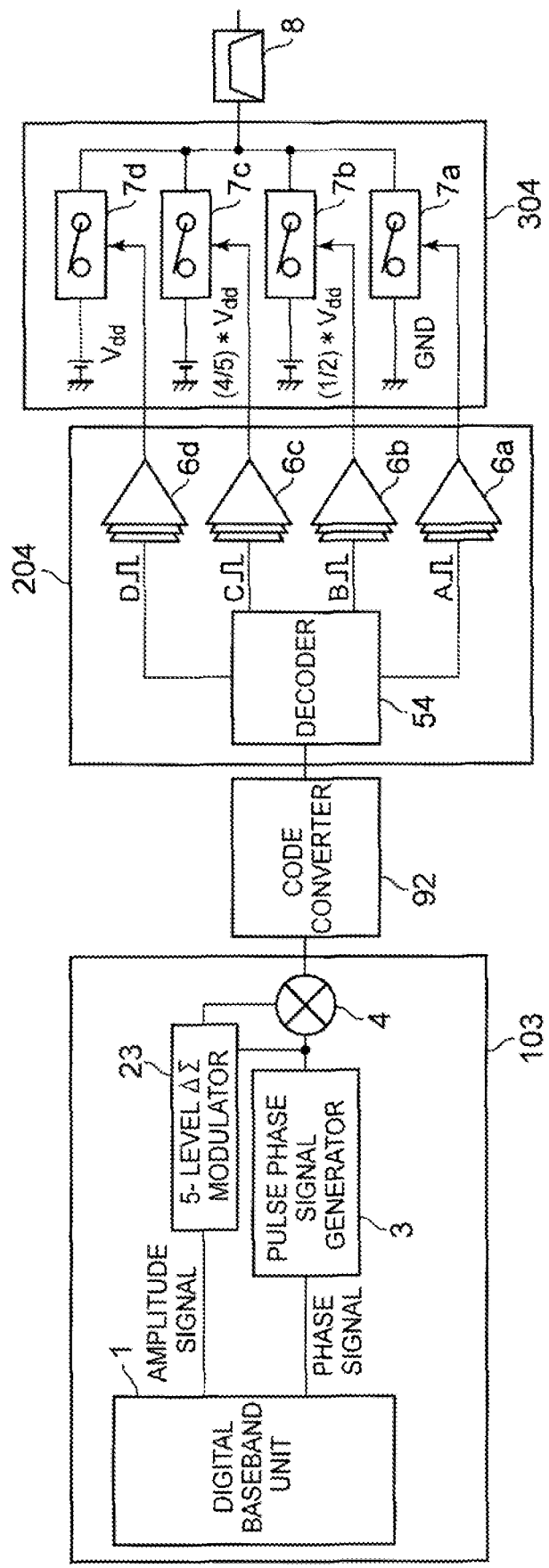
FIG. 6 is a block diagram showing a second exemplary embodiment of the RF signal generation device.

FIG. 6 is a block diagram showing a second exemplary embodiment of the RF signal generation device. The RF signal generation device shown in FIG. 6 includes an RF signal generation unit 103, a code converter 92, a driver unit 204, a class-D amplifier 304, and a filter circuit 8.

While the RF signal generation unit 102 in the first exemplary embodiment had the four-level delta-sigma modulator 22, the RF signal generation unit 103 has a five-level delta-sigma modulator (five-level ΔΣ modulator) 23. The other components in the RF signal generation unit 103 are identical to those in the RF signal generation unit 102.

While the driver unit 203 in the first exemplary embodiment had the decoder 53 and the driver amplifiers 6a, 6b, and 6c, the driver unit 204 has a decoder 54 and four driver amplifiers 6a, 6b, 6c, and 6d. The decoder 54 converts an output signal from the RF signal generation unit 103 into four kinds of control signals (A, B, C, D) in which one attains a high level (High) and the others attain a low level (Low).

The class-D amplifier 304 includes four switch elements 7a, 7b, 7c, and 7d.

The code converter 92 is similar in function to the code converter 91 in the first exemplary embodiment, but differs in resolution of the input and output signals.

FIG. 7A and FIG. 7B are diagrams illustrating signal conversion by the code converter 92. The code converter 92 stores data of a conversion table indicating signal conversion as shown in FIG. 7A and FIG. 7B, for example.

In the second exemplary embodiment, the output levels of the five-level delta-sigma modulator 23 are (0, ⅕, ½, ⅘, 1), for example. In the RF signal, 0 and any other value (⅕, ½, ⅘, or 1) appear alternately.

The code converter 92 converts the five-level RF signal into a four-level signal in accordance with the conversion table shown in FIG. 7A and FIG. 7B. With the RF signal having 0 and any other value appearing alternately, the code converter 92 accordingly performs the signal conversion by using two consecutive values including 0 as a unit, as with the code converter 91 in the first exemplary embodiment.

Specifically, as shown in FIG. 7A, when 1 and 0 are input sequentially, the code converter 92 outputs 1 and 0 sequentially. When ⅘ and 0 are input sequentially, the code converter 92 outputs ⅘ and 0 sequentially. When ½ and 0 are input sequentially, the code converter 92 outputs ½ and 0 sequentially. When ⅕ and 0 are input sequentially, the code converter 92 outputs 1 and ⅘ sequentially.

It should be noted that the signal may be split in a different manner, as in the first exemplary embodiment. That is, as shown in FIG. 7B, the code converter 92 may output 0 and 1 sequentially when 0 and 1 are input sequentially, it may output 0 and ⅘ sequentially when 0 and ⅘ are input sequentially, it may output 0 and ½ sequentially when 0 and ½ are input sequentially, and it may output ⅘ and 1 sequentially when 0 and ⅕ are input sequentially.

FIG. 8 is a diagram illustrating signal conversion by the decoder 54. The decoder 54 stores data of a conversion table indicating signal conversion as shown in FIG. 8, for example. The decoder 54 converts an output signal from the code converter 92 into four kinds of control signals (A, B, C, D) in which one attains High and the others attain Low, as shown in FIG. 8.

The control signals A, B, C, and D are input to the class-D amplifier 304 via the driver amplifiers 6a, 6b, 6c, and 6d. When the output value from the code converter 92 is 1, High is input to the switch element 7d connected to $V_{dd}$. When the output value from the code converter 92 is ⅘, High is input to the switch element 7c connected to $4V_{dd}/5$. When the output value from the code converter 92 is ½, High is input to the switch element 7b connected to $V_{dd}/2$. When the output value from the code converter 92 is 0, High is input to the switch element 7a connected to GND. Each switch element 7a, 7b, 7c, 7d attains an on state when the control signal is High and an off state when the control signal is Low. With the above processing, the RF signal is amplified, in the class-D amplifier 304, so as to be linear with respect to the output level of the code converter 92. That is, an amplified four-level RF signal is obtained.

The four-level RF signal output from the class-D amplifier 304 is input to the filter circuit 8. Then, a desired signal having the desired frequency band amplified is output from the filter circuit 8 as an output RF signal.

It should be noted that the set of the output voltages of the five-level delta-sigma modulator 23 is not limited to (0, ⅕, ½, ⅘, 1). The threshold voltage of the comparator (see FIG. 22) in the five-level delta-sigma modulator 23 may be set such that the output from the five-level delta-sigma modulator 23 takes five values of 0, v1, v2, 1−v1, and 1. Here, v1 and v2 each take a value greater than 0 and smaller than 1. In this case, the output level of 1−v1 ceases to appear after the signal conversion by the code converter 92. Further, the output voltage from the class-D amplifier 304 takes four values of $V_{dd}$, $V_{dd}*v1$, $V_{dd}*v2$, and 0. The aforesaid output voltages (0, ⅕, ½, ⅘, 1) from the five-level delta-sigma modulator 23 correspond to the voltages when v1 is ⅘ and v2 is ½.

More generally, the five-level delta-sigma modulator 23 outputs a multi-level signal including, as its output levels, at least one set of $V_k$, $V_k'$, and $V_k''$ expressed by the following expression, with $V_{min}$ (in the present exemplary embodiment, 0) being the minimum output level.

$$V_k - V_{min} = V_k'' - V_k'$$

In the present exemplary embodiment, $V_k=⅕$, $V_k''=1$, and $V_k'=⅘$.

Further, the five-level delta-sigma modulator 23 outputs a multi-level signal including, as its output levels, $V_k$ and $V_k'$ expressed by the following expression, with $V_{min}$ (in the present exemplary embodiment, 0) being the minimum output level and $V_{max}$ being the maximum output level (in the present exemplary embodiment, 1).

$$V_k - V_{min} = V_{max} - V_k'$$

In the present exemplary embodiment, $V_k=⅕$ and $V_k'=⅘$.

In the second exemplary embodiment, the code converter 92 adds, to the input five-level RF signal, a signal having no component in the desired frequency band, to thereby obtain a four-level RF signal. Thus, when comparing the input five-level RF signal with the four-level RF signal, there is no change in quantization noise in and around the desired frequency band. Therefore, the quantization noise included in the four-level RF signal from the code converter 92 becomes smaller than that in an RF signal obtained by a four-level delta-sigma modulator based on the scheme as described in PTL 1. As a result, a radio signal is obtained that has an improved signal-to-noise power ratio than a radio signal generated by a radio transmitter having the four-level delta-sigma modulator based on the scheme described in PTL 1.

Further, with the use of the code converter 92, the RF signal generation device is capable of amplifying a multi-level delta-sigma-modulated signal by the class-D amplifier 304 having a smaller number of output values. That is, using the four-level class-D amplifier 303, it is possible to obtain the noise characteristics comparable to those in the case of using a five-level class-D amplifier (configuration obtained by expanding the configuration of the class-D amplifier 302 shown in FIG. 23 to conform to five values).

Further, when the threshold voltage of the comparator in the five-level delta-sigma modulator 23 is set to a value according to the input modulation wave, the quantization noise is further reduced. For example, when the threshold voltage is set to a voltage corresponding to the peak-to-average power ratio of the input signal, the resolution in the vicinity of the voltage value having high occurrence frequency in the input signal is improved as compared to that of the peripheral voltage. As a result, the quantization noise is reduced as seen as the entire input signal.

Exemplary Embodiment 3

Figure 9:
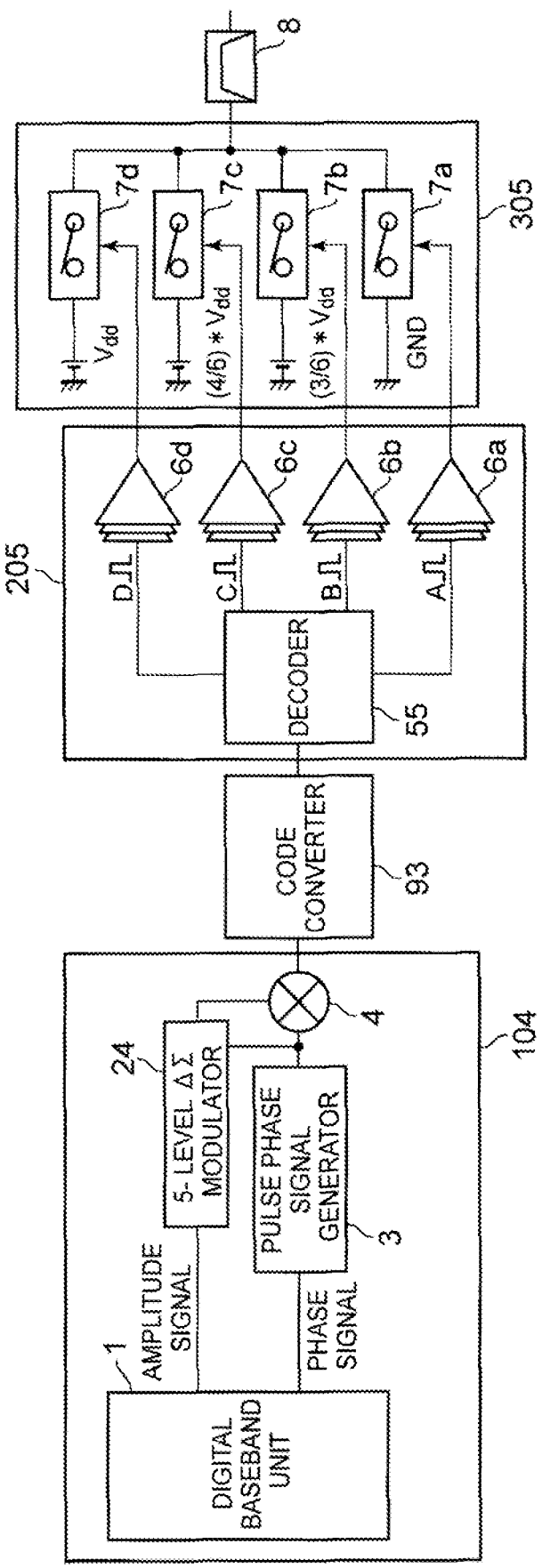
FIG. 9 is a block diagram showing a third exemplary embodiment of the RF signal generation device.

FIG. 9 is a block diagram showing a third exemplary embodiment of the RF signal generation device. The RF signal generation device shown in FIG. 9 includes an RF signal generation unit 104, a code converter 93, a driver unit 205, a class-D amplifier 305, and a filter circuit 8.

A five-level delta-sigma modulator (five-level ΔΣ modulator) 24 in the third exemplary embodiment subjects the amplitude signal to delta-sigma modulation to generate a five-level digital amplitude signal, similarly as the five-level delta-sigma modulator 23 in the second exemplary embodiment. However, the output voltage levels from the RF signal generation unit 104 take five values of (0, ⅙, ⅜, ⅘, 1). Further, the signal conversion by the code converter 93 differs from the signal conversion by the code converter 92 in the second exemplary embodiment. The power supply voltage of the class-D amplifier 305 differs from the power supply voltage of the class-D amplifier 304 in the second exemplary embodiment. The other components in the RF signal generation device are identical to those in the RF signal generation device in the second exemplary embodiment.

FIG. 10 is a diagram illustrating signal conversion by the code converter 93. The code converter 93 stores data of a conversion table indicating signal conversion as shown in FIG. 10, for example.

In the third exemplary embodiment, the output levels of the five-level delta-sigma modulator 24 are (0, 1/6, 3/6, 4/6, 1), for example. In the RF signal, 0 and any other value (1/6, 3/6, 4/6, or 1) appear alternately.

The code converter 93 converts the five-level RF signal into a four-level signal in accordance with the conversion table shown in FIG. 10. With the RF signal having 0 and any other value appearing alternately, the code converter 93 accordingly performs the signal conversion by using two consecutive values including 0 as a unit, as with the code converter 91 in the first exemplary embodiment and the code converter 92 in the second exemplary embodiment.

Specifically, when 1 and 0 are input sequentially, the code converter 93 outputs 1 and 0 sequentially. When 4/6 and 0 are input sequentially, the code converter 93 outputs 4/6 and 0 sequentially. When 3/6 and 0 are input sequentially, the code converter 93 outputs 3/6 and 0 sequentially. When 1/6 and 0 are input sequentially, the code converter 93 outputs 4/6 and 3/6 sequentially.

It should be noted that the signal may be split in a different manner, as in the first and second exemplary embodiments. That is, the code converter 93 may output 0 and 1 sequentially when 0 and 1 are input sequentially, it may output 0 and 4/6 sequentially when 0 and 4/6 are input sequentially, it may output 0 and 3/6 sequentially when 0 and 3/6 are input sequentially, and it may output 3/6 and 4/6 sequentially when 0 and 1/6 are input sequentially.

FIG. 11 is a diagram illustrating signal conversion by the decoder 55. The decoder 55 has a conversion table indicating signal conversion as shown in FIG. 11, for example. The decoder 55 converts the output signal from the code converter 93 into four kinds of control signals (A, B, C, D) in which one attains High and the others attain Low, as shown in FIG. 11.

The control signals A, B, C, and D are input to the class-D amplifier 305 via the driver amplifiers 6a, 6b, 6c, and 6d. When the output value from the code converter 93 is 1, High is input to the switch element 7d connected to $V_{dd}$. When the output value from the code converter 93 is 4/6, High is input to the switch element 7c connected to $4V_{dd}/6$. When the output value from the code converter 93 is 3/6, High is input to the switch element 7b connected to $3V_{dd}/6$. When the output value from the code converter 93 is 0, High is input to the switch element 7a connected to GND. The RF signal is amplified, by the class-D amplifier 305, so as to be linear with respect to the output level of the code converter 93. That is, an amplified four-level RF signal is obtained.

The four-level RF signal output from the class-D amplifier 305 is input to the filter circuit 8. Then, a desired signal having the desired frequency band amplified is output from the filter circuit 8.

It should be noted that the set of the output voltages of the five-level delta-sigma modulator 24 is not limited to (0, 1/6, 3/6, 4/6, 1). The threshold voltage of the comparator (see FIG. 22) in the five-level delta-sigma modulator 24 may be set such that the output from the five-level delta-sigma modulator 24 takes five values of 0, v1, v2, v1+v2, and 1. Here, v1 and v2 each take a value greater than 0 and smaller than 1. Further, v1+v2 does not exceed 1. In this case, the output level of v1 ceases to appear after the signal conversion by the code converter 93. Further, the output voltage from the class-D amplifier 305 takes four values of $V_{dd}$, $V_{dd}$*v2, $V_{dd}$*(v1+v2), and 0. The aforesaid output voltages (0, 1/6, 3/6, 4/6, 1) from the five-level delta-sigma modulator 24 correspond to the voltages when v1 is 1/6 and v2 is 3/6.

More generally, the five-level delta-sigma modulator 24 outputs a multi-level signal including, as its output levels, at least one set of $V_k$, $V_k'$, and $V_k''$ expressed by the following expression, with $V_{min}$ (in the present exemplary embodiment, 0) being the minimum output level.

$$V_k - V_{min} = V_k'' - V_k'$$

In the present exemplary embodiment, $V_k$=1/6, $V_k''$=4/6, and $V_k'$=3/6.

The third exemplary embodiment also provides advantageous effects similar to those in the second exemplary embodiment.

Exemplary Embodiment 4

Figure 12:
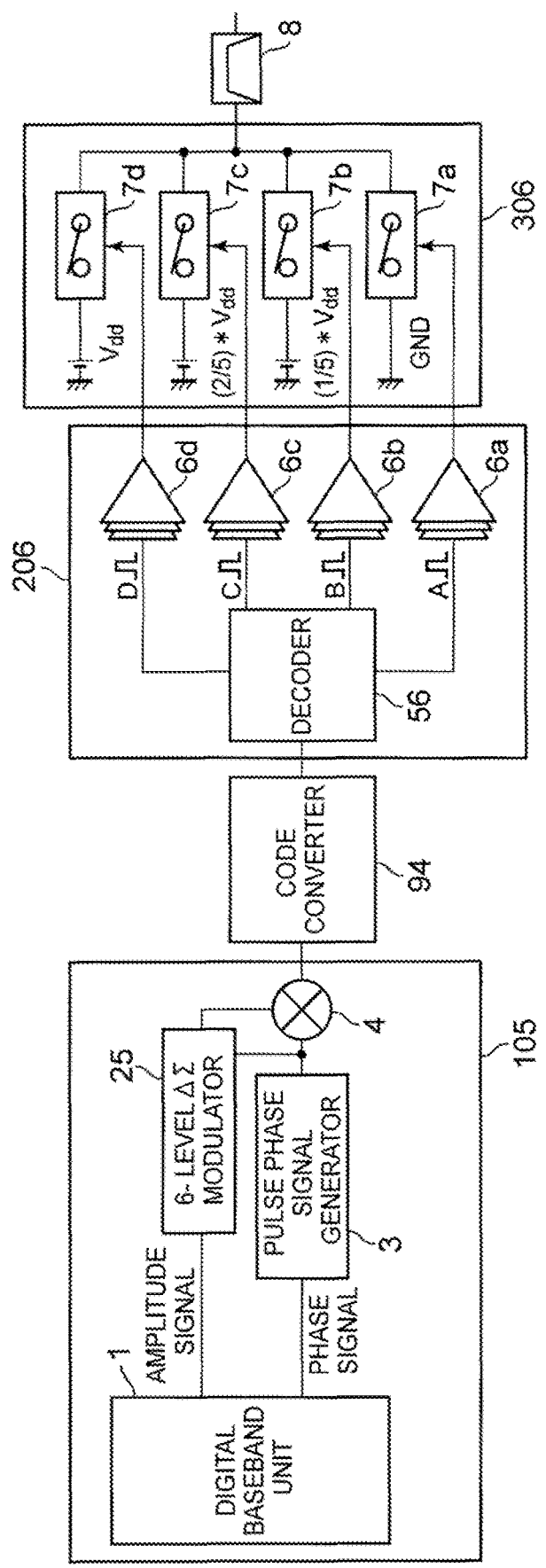
FIG. 12 is a block diagram showing a fourth exemplary embodiment of the RF signal generation device.

FIG. 12 is a block diagram showing a fourth exemplary embodiment of the RF signal generation device. The RF signal generation device shown in FIG. 12 includes an RF signal generation unit 105, a code converter 94, a driver unit 206, a class-D amplifier 306, and a filter circuit 8.

In the fourth exemplary embodiment, the RF signal generation unit 105 has a six-level delta-sigma modulator (six-level ΔΣ modulator) 25. The other components in the RF signal generation unit 105 are identical to those in the RF signal generation unit in each of the above exemplary embodiments.

The six-level delta-sigma modulator 25 subjects the amplitude signal to delta-sigma modulation to generate a six-level (0, 1/5, 2/5, 3/5, 4/5, 1) digital amplitude signal.

FIG. 13 is a diagram illustrating signal conversion by the code converter 94. The code converter 94 stores data of a conversion table indicating signal conversion as shown in FIG. 13, for example.

In the fourth exemplary embodiment, the output levels of the six-level delta-sigma modulator 25 are (0, 1/5, 2/5, 3/5, 4/5, 1), for example. In the RF signal, 0 and any other value (1/5, 2/5, 3/5, 4/5, or 1) appear alternately.

The code converter 94 converts the six-level RF signal into a four-level signal in accordance with the conversion table shown in FIG. 13. With the RF signal having 0 and any other value appearing alternately, the code converter 94 accordingly performs the signal conversion by using two consecutive values including 0 as a unit, as with the code converters 91, 92, and 93 in the above exemplary embodiments.

Specifically, when 1 and 0 are input sequentially, the code converter 94 outputs 1 and 0 sequentially. When 4/5 and 0 are input sequentially, the code converter 94 outputs 1 and 1/5 sequentially. When 3/5 and 0 are input sequentially, the code converter 94 outputs 1 and 2/5 sequentially. When 2/5 and 0 are input sequentially, the code converter 94 outputs 2/5 and 0 sequentially. When 1/5 and 0 are input sequentially, the code converter 94 outputs 1/5 and 0 sequentially.

It should be noted that the signal may be split in a different manner, as in each of the above exemplary embodiments. That is, the code converter 94 may output 0 and 1 sequentially when 0 and 1 are input sequentially, it may output 1/5 and 1 sequentially when 0 and 4/5 are input sequentially, it may output 2/5 and 1 sequentially when 0 and 3/5 are input sequentially, it may output 0 and 2/5 sequentially when 0 and 2/5 are input sequentially, and it may output 0 and 1/5 sequentially when 0 and 1/5 are input sequentially.

FIG. 14 is a diagram illustrating signal conversion by the decoder 56. The decoder 56 stores data of a conversion table indicating signal conversion as shown in FIG. 14, for example. The decoder 56 converts the output signal from the code converter 93 into four kinds of control signals (A, B, C, D) in which one attains High and the others attain Low, as shown in FIG. 14.

The control signals A, B, C, and D are input to the class-D amplifier 306 via the driver amplifiers 6a, 6b, 6c, and 6d. When the output value from the code converter 94 is 1, High is input to the switch element 7d connected to $V_{dd}$. When the output value from the code converter 94 is ⅔, High is input to the switch element 7c connected to $2V_{dd}/5$. When the output value from the code converter 94 is ⅕, High is input to the switch element 7b connected to $V_{dd}/5$. When the output value from the code converter 94 is 0, High is input to the switch element 7a connected to GND. With the above processing, the RF signal is amplified, in the class-D amplifier 306, so as to be linear with respect to the output level of the code converter 94. That is, an amplified four-level RF signal is obtained.

The four-level RF signal output from the class-D amplifier 306 is input to the filter circuit 8. Then, a desired signal having the desired frequency band amplified is output from the filter circuit 8.

It should be noted that the set of the output voltages of the six-level delta-sigma modulator 25 is not limited to (0, ⅕, ⅖, ⅗, ⅘, 1). The threshold voltage of the comparator (see FIG. 22) in the six-level delta-sigma modulator 25 may be set such that the output from the six-level delta-sigma modulator 25 takes six values of 0, 1−v1, 1−v2, v2, v1, and 1. Here, v1 and v2 each take a value greater than 0 and smaller than 1. In this case, the output levels of v1 and v2 cease to appear after the signal conversion by the code converter 94. Further, the output voltage from the class-D amplifier 305 takes four values of $V_{dd}$, $V_{dd}*(1-v2)$, $V_{dd}*(1-v1)$, and 0. The aforesaid output voltages (0, ⅕, ⅖, ⅗, ⅘, 1) from the six-level delta-sigma modulator 25 correspond to the voltages when v1 is ⅘ and v2 is ⅗.

More generally, the six-level delta-sigma modulator 25 outputs a multi-level signal including, as its output levels, at least one set of $V_k$, $V_k'$, and $V_k''$ expressed by the following expression, with $V_{min}$ (in the present exemplary embodiment, 0) being the minimum output level.

$$V_k - V_{min} = V_k'' - V_k'$$

In the present exemplary embodiment, ($V_k$, $V_k''$, $V_k'$)=(⅘, 1, ⅕), (⅗, 1, ⅖).

Further, the six-level delta-sigma modulator 25 outputs a multi-level signal including, as its output levels, at least one set of $V_k$ and $V_k'$ expressed by the following expression, with $V_{min}$ (in the present exemplary embodiment, 0) being the minimum output level and $V_{max}$ being the maximum output level (in the present exemplary embodiment, 1).

$$V_k - V_{min} = V_{max} - V_k'$$

In the present exemplary embodiment, ($V_k$, $V_k'$)=(⅘, ⅕), (⅗, ⅖).

The present exemplary embodiment also provides advantageous effects similar to those in each of the above exemplary embodiments.

Exemplary Embodiment 5

Figure 15:
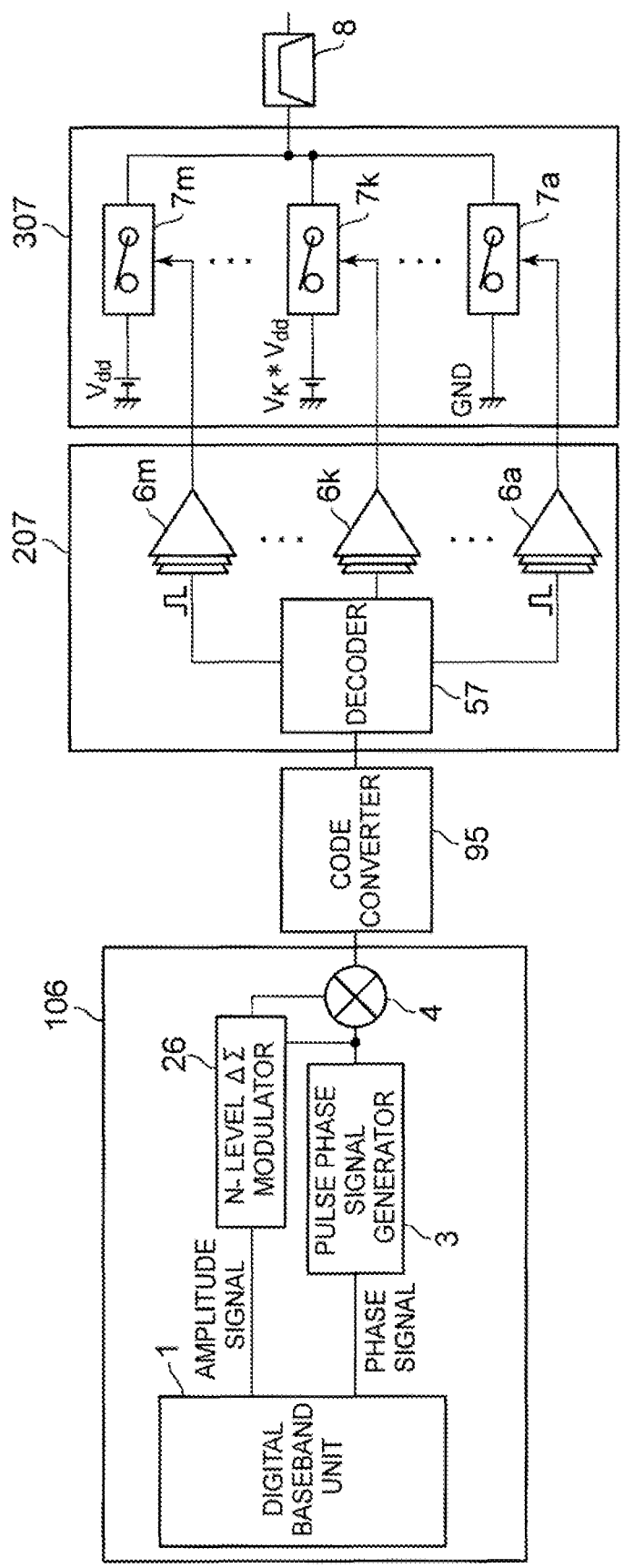
FIG. 15 is a block diagram showing a fifth exemplary embodiment of the RF signal generation device.

FIG. 15 is a block diagram showing a fifth exemplary embodiment of the RF signal generation device. The RF signal generation device shown in FIG. 15 includes an RF signal generation unit 106, a code converter 95, a driver unit 207, a class-D amplifier 307, and a filter circuit 8.

In the fifth exemplary embodiment, the RF signal generation unit 106 has an N-level delta-sigma modulator (N-level ΔΣ modulator) 26, where N is an integer of 4 or greater. The other components in the RF signal generation unit 106 are identical to those in the RF signal generation unit in each of the above exemplary embodiments.

The driver unit 207 includes M driver amplifiers 6a, . . . , 6k, . . . , 6m. Further, the class-D amplifier 307 includes M switch elements 7a, . . . , 7k, . . . , 7m. Here, M is an integer that satisfies: [(N+2)/2]≤M<N.

It should be noted that the fifth exemplary embodiment is a generic exemplary embodiment of the first through fourth exemplary embodiments.

In the output from the N-level delta-sigma modulator 26, 0 and any other value (among $V_1$, $V_2$, . . . , $V_{N-M}$, 1−$V_{N-M}$, . . . , 1−$V_2$, 1−$V_1$, 1, and (2M−N−2) output levels not included therein) appear alternately. The code converter 95 performs the signal conversion by using two consecutive values including 0 as a unit.

When 1 and 0 are input sequentially, the code converter 95 outputs 1 and 0 sequentially. When (1−$V_K$) and 0 are input sequentially, the code converter 95 outputs 1 and $V_K$ sequentially. Here, K is an integer not smaller than 1 and not greater than (N−M). It should be noted that the signal may be split in a different manner, as in the above exemplary embodiments. That is, the code converter 95 may output 0 and 1 sequentially when 0 and 1 are input sequentially, and it may output $V_K$ and 1 sequentially when 0 and (1−$V_K$) are input sequentially.

The decoder 57 converts the output signal from the code converter 95 into M kinds of control signals in which on M control signals are input to the class-D amplifier 307 via the driver amplifiers 6a, . . . , 6k, . . . , 6m. In the class-D amplifier 307, the switch elements 7a, . . . , 7k, . . . , 7m each attain an on state when the control signal is High and an off state when the control signal is Low. With the above processing, the RF signal is amplified, in the class-D amplifier 307, so as to be linear with respect to the output level of the code converter 95. That is, an amplified M-level RF signal is obtained.

The M-level RF signal output from the class-D amplifier 307 is input to the filter circuit 8. Then, a desired signal with the desired frequency band amplified is output from the filter circuit 8.

Exemplary Embodiment 6

Figure 16:
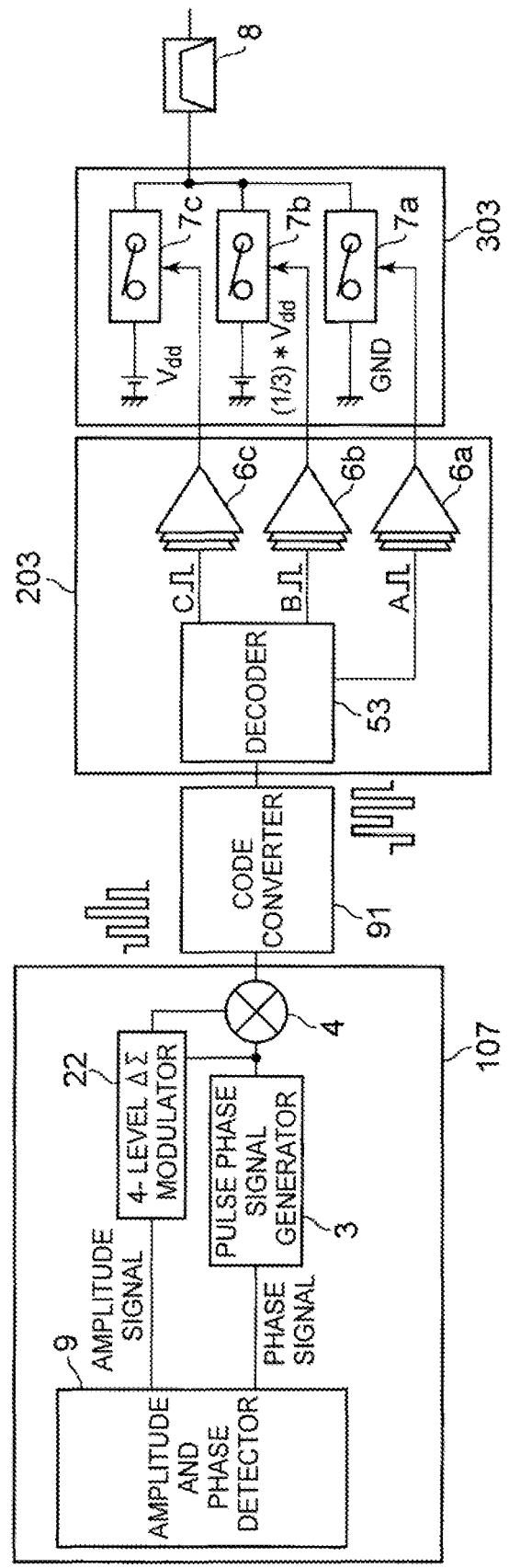
FIG. 16 is a block diagram showing a sixth exemplary embodiment of the RF signal generation device.

FIG. 16 is a block diagram showing a sixth exemplary embodiment of the RF signal generation device. The RF signal generation device shown in FIG. 16 includes an RF signal generation unit 107, a code converter 91, a driver unit 203, a class-D amplifier 303, and a filter circuit 8.

The RF signal generation unit 107 includes an amplitude and phase detector 9, in place of the digital baseband unit 1 in the RF signal generation device in the first exemplary embodiment. The amplitude and phase detector 9 separates and outputs an amplitude component and a phase component of a signal input to the RF signal generation device. The other components in the RF signal generation device are identical to those in the first exemplary embodiment.

While the RF signal generation device in the sixth exemplary embodiment has a configuration in which the amplitude and phase detector 9 is provided in place of the digital baseband unit 1 in the RF signal generation device in the first exemplary embodiment, it may have a configuration in which the amplitude and phase detector 9 is provided in place of the digital baseband unit 1 in any of the second through fifth RF signal generation devices.

In the sixth exemplary embodiment, in addition to the advantageous effects of the RF signal generation devices in the first through fifth exemplary embodiments, a signal to be amplified can be obtained from the outside, so the degree of freedom of the configuration of the RF signal generation device is increased.

Exemplary Embodiment 7

Figure 17:
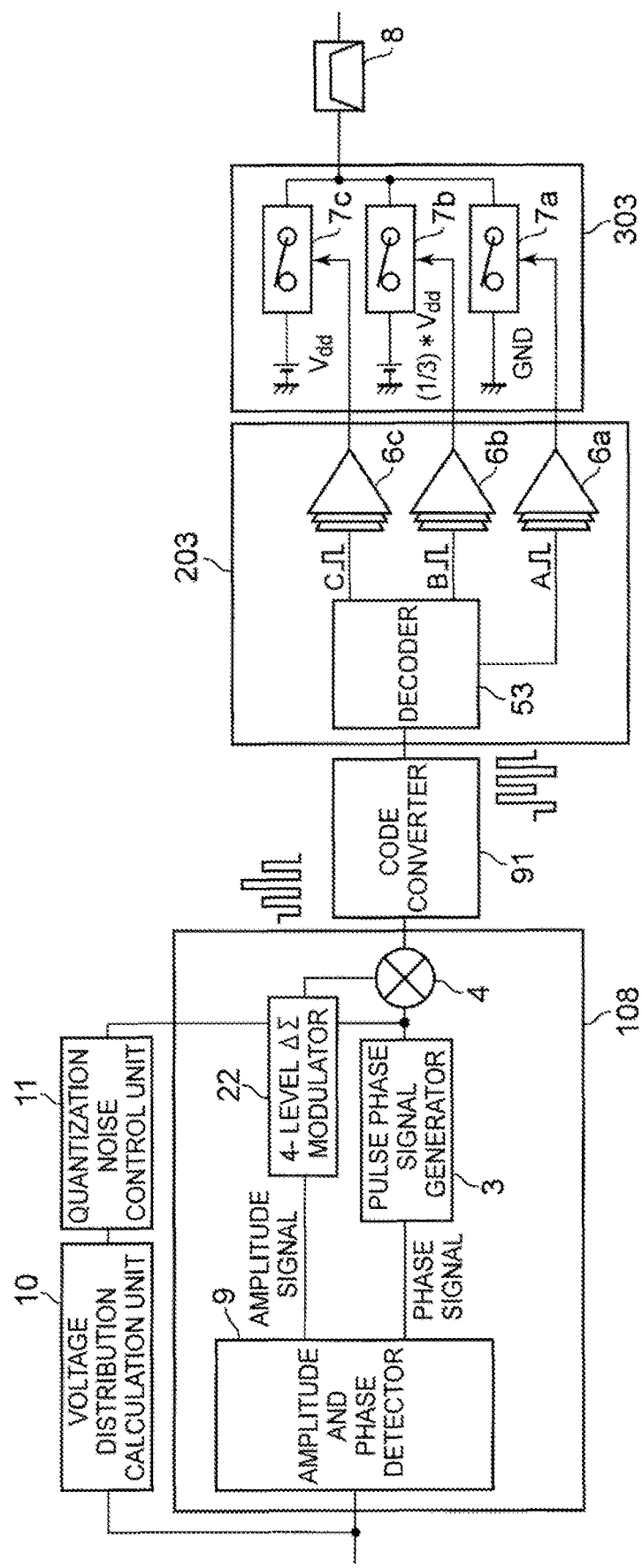
FIG. 17 is a block diagram showing a seventh exemplary embodiment of the RF signal generation device.

FIG. 17 is a block diagram showing a seventh exemplary embodiment of the RF signal generation device. The RF signal generation device shown in FIG. 17 has a voltage distribution calculation unit 10 and a quantization noise control unit 11 added to the RF signal generation device of the sixth exemplary embodiment shown in FIG. 16.

The voltage distribution calculation unit 10 calculates voltage distribution of an input signal. The quantization noise control unit 11 controls the threshold voltage of the comparator (see FIG. 22) in the four-level delta-sigma modulator 22 of the RF signal generation unit 108, on the basis of the voltage distribution calculated by the voltage distribution calculation unit 10, such that the quantization noise included in the output signal becomes smaller.

Specifically, the voltage distribution calculation unit 10 calculates frequency distribution of the voltage included in the input signal. The quantization noise control unit 11 receives the voltage frequency distribution from the voltage distribution calculation unit 10. Then, the quantization noise control unit 11 controls the threshold voltage of the comparator in the four-level delta-sigma modulator 22 such that the output voltage from the comparator coincides with the voltage of high frequency of appearance.

While the RF signal generation device of the seventh exemplary embodiment has the voltage distribution calculation unit 10 and the quantization noise control unit 11 added to the RF signal generation device that has a configuration in which the amplitude and phase detector 9 has been provided in place of the digital baseband unit 1 in the RF signal generation device of the first exemplary embodiment, the voltage distribution calculation unit 10 and the quantization noise control unit 11 may be added to an RF signal generation device that has a configuration in which the amplitude and phase detector 9 has been provided in place of the digital baseband unit 1 in the RF signal generation device of any of the second through fifth exemplary embodiments.

In the seventh exemplary embodiment, in addition to the advantageous effects of the RF signal generation device of the sixth exemplary embodiment, it is possible to efficiently reduce the quantization noise even in the case where a signal having unknown voltage frequency distribution is input.

Exemplary Embodiment 8

Figure 18:
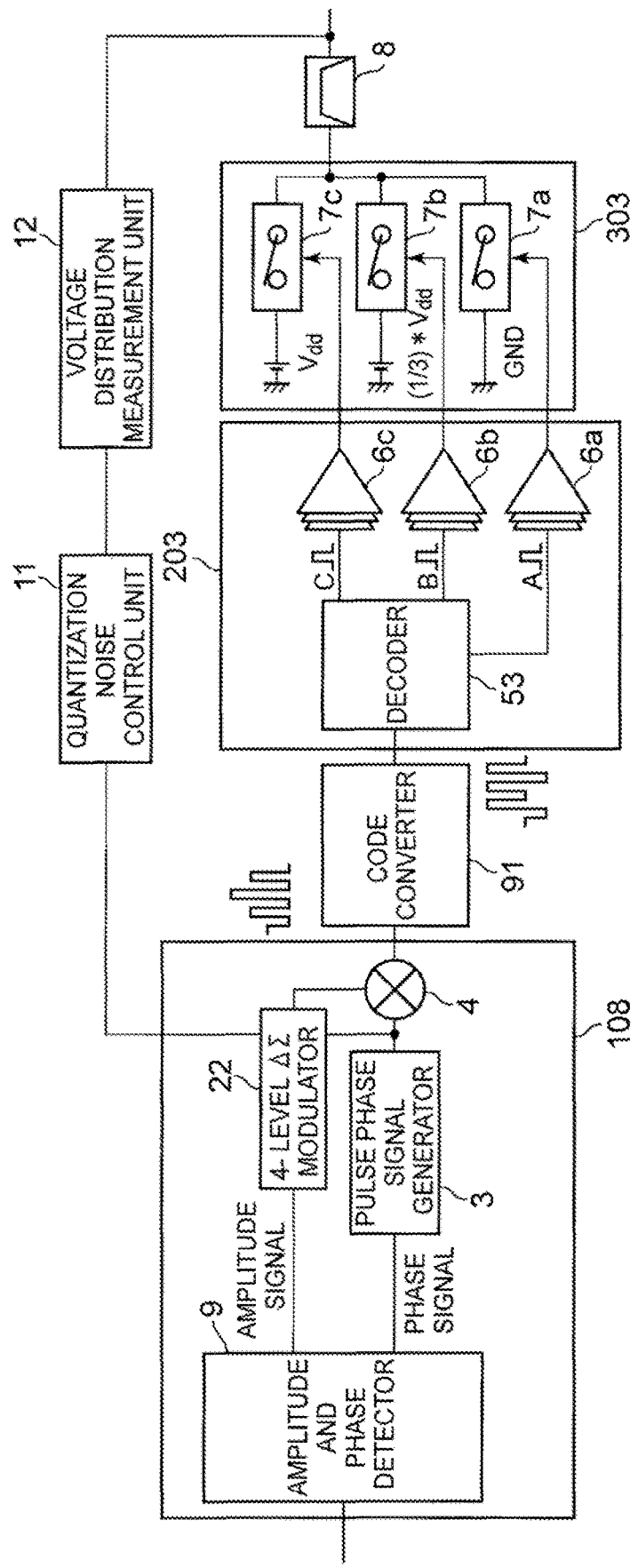
FIG. 18 is a block diagram showing an eighth exemplary embodiment of the RF signal generation device.

FIG. 18 is a block diagram showing an eighth exemplary embodiment of the RF signal generation device. The RF signal generation device shown in FIG. 18 has a voltage distribution measurement unit 12 and a quantization noise control unit 11 added to the RF signal generation device of the sixth exemplary embodiment shown in FIG. 16.

The voltage distribution measurement unit 12 measures quantization noise in the vicinity of a desired frequency band of an output signal. The quantization noise control unit 11, on the basis of the quantization noise measured by the voltage distribution measurement unit 12, adjusts the threshold voltage of the comparator in the delta-sigma modulator such that the quantization noise included in the output signal becomes smaller. That is, the quantization noise control unit 11 performs feedback control so as to reduce the quantization noise included in the signal (voltage) that is output from the RF signal generation device.

While the RF signal generation device of the eighth exemplary embodiment has the voltage distribution measurement unit 12 and the quantization noise control unit 11 added to the RF signal generation device that has a configuration in which the amplitude and phase detector 9 has been provided in place of the digital baseband unit 1 in the RF signal generation device of the first exemplary embodiment, the voltage distribution measurement unit 12 and the quantization noise control unit 11 may be added to an RF signal generation device that has a configuration in which the amplitude and phase detector 9 has been provided in place of the digital baseband unit 1 in the RF signal generation device of any of the second through fifth exemplary embodiments.

In the eighth exemplary embodiment, in addition to the advantageous effects of the RF signal generation device of the sixth exemplary embodiment, it is possible to efficiently reduce the quantization noise even in the case where a signal having unknown voltage frequency distribution is input.

Exemplary Embodiment 9

Figure 19:
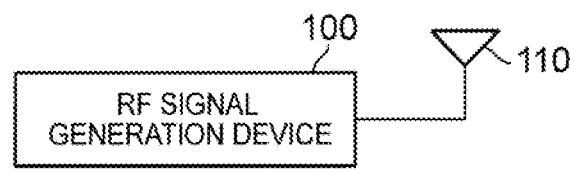
FIG. 19 is a block diagram showing a configuration of a radio transmitter which uses the RF signal generation device.

FIG. 19 is a block diagram showing a configuration of a radio transmitter using an RF signal generation device. The radio transmitter shown in FIG. 19 includes an RF signal generation device 100 and an antenna 110.

For the RF signal generation device 100, any of the RF signal generation devices of the first through eighth exemplary embodiments is used. Therefore, the configuration of the RF signal generation device 100 is identical to that of the RF signal generation device shown in FIG. 1, 6, 9, 12, 15, 16, 17, or 18. The antenna 110 receives an amplified RF signal (output RF signal) from the filter circuit in the RF signal generation device 100 (corresponding to the filter circuit 8 in FIG. 1, 6, 9, 12, 15, 16, 17, or 18). The output RF signal of the RF signal generation device 100 is radiated from the antenna 110 as a radio wave.

It should be noted that a radio equipment including a receiver and an antenna duplexer along with the RF signal generation device 100 and the antenna 110 may be configured.

As described above, in each of the above exemplary embodiments, it is possible to suppress the increase of the cost due to the increased number of the switch elements used in the class-D amplifier as well as the addition of the accompanying driver and power supply circuits, without degradation of the noise characteristics. Further, with the reduction in circuit scale, the time for designing the RF signal generation device and a radio transmitter or radio equipment using the same can be reduced.

Further, the RF signal generation device according to the present invention is applicable, not only to the radio transmitter or radio equipment in the radio base station or the like, but also to, for example, a high-frequency signal transmission system that is required to make outputs variable, such as a radar.

While the delta-sigma modulator was used in the RF signal generation unit in each of the above exemplary embodiments, pulse width modulation (PWM), pulse density modulation (PDM), or other pulse modulation schemes may be used in place of the delta-sigma modulation.

Figure 20:
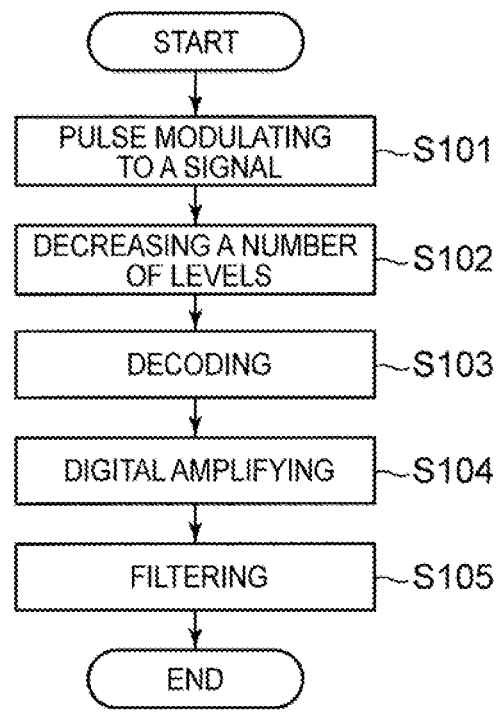
FIG. 20 is a flowchart illustrating a process flow of the RF signal generation device.
Figure 21:
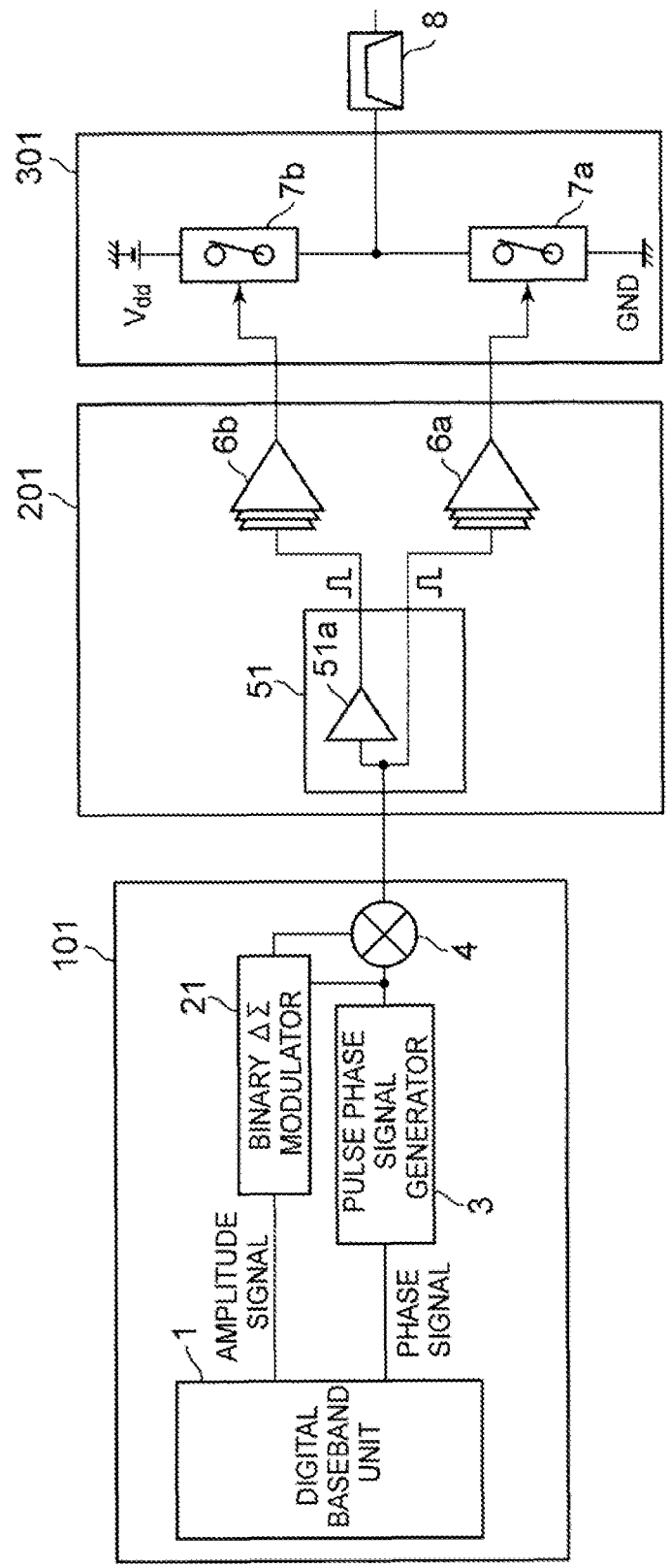
FIG. 21 is a block diagram showing a configuration of a radio transmitter which uses a conventional envelope delta-sigma modulator.

FIG. 20 is a flowchart illustrating a process flow of the RF signal generation device in each of the above exemplary embodiments. The RF signal generation device performs pulse-modulation (for example, delta-sigma modulation) on a prescribed signal (for example, a baseband signal generated by the RF signal generation device or a baseband signal based on an input signal) such that the signal has four or more-level discrete output levels and that the lowest level (for example, 0) and any other level appear alternately (step S101). Further, the RF signal generation device converts the pulse-modulated signal into an RF signal having a smaller number of levels than the number of levels of that signal (step S102). The RF signal generation device further converts (decodes) the obtained multi-level RF signal into a one-bit signal corresponding to the level (a multi-bit binary signal in which the bit corresponding to the signal level is significant; see FIG. 5 and others) (step S103). Further, the RF signal generation device uses a digital amplifier such as a class-D amplifier to amplify the one-bit signal to a signal of the voltage corresponding to the level before being converted (step S104). The RF signal generation device then filters the amplified digital signal, and brings it back to an analog RF signal (output RF signal) (step S105).

A part or a whole of the above-described exemplary embodiments may be described as in the following supplementary notes, although the configuration of the present invention is not limited to the following configurations.

(Supplementary note 1) A radio frequency (RF) signal generation device comprising:

an RF signal generation unit that pulse-modulates a prescribed signal to generate an output signal in which four or more-level discrete output levels appear, and a lowest level and any other level appear alternately;

a code converter that converts the output signal from the RF signal generation unit into an RF signal in which a smaller number of levels than the number of levels in the output signal;

a driver unit that converts the RF signal from the code converter into a binary signal comprising plural bits in which bits corresponding to signal levels in the RF signal are significant; and a digital amplifier that outputs a voltage corresponding to levels in the RF signal outputted from the code converter, on the basis of an output signal from the driver unit.

(Supplementary note 2) The RF signal generation device according to supplementary note 1, wherein the RF signal generation unit includes a pulse phase signal generator that generates a pulse phase signal having a pulse waveform shape on the basis of a phase signal of a baseband signal, a delta-sigma modulator that multi-levels an amplitude signal of the baseband signal to four or more levels by delta-sigma modulation in synchronization with the pulse phase signal, and a multiplier that multiplies an output signal from the delta-sigma modulator by the pulse phase signal.

(Supplementary note 3) The RF signal generation device according to supplementary note 2, wherein the delta-sigma modulator outputs a multi-level signal comprising one or more sets of output levels $V_k$, $V_k'$, and $V_k''$ satisfying an expression (1), under the condition that $V_{min}$ is a minimum output level.

$$V_k - V_{min} = V_k'' - V_k' \quad (1)$$

(Supplementary note 4) The RF signal generation device according to supplementary note 2 or 3, wherein the delta-sigma modulator outputs a multi-level signal comprising one or more sets of output levels $V_k$ and $V_k'$ satisfying an expression (2), under the condition that $V_{min}$ is a minimum output level and $V_{max}$ is a maximum output level.

$$V_k - V_{min} = V_{max} - V_k' \quad (2)$$

(Supplementary note 5) The RF signal generation device according to any of supplementary notes 2 to 4, wherein the digital amplifier outputs a voltage having output levels that is in a linear relationship with levels in the RF signal outputted from the code converter.

(Supplementary note 6) The RF signal generation device according to any of supplementary notes 1 to 5, wherein the code converter converts a set of the lowest level and another level into a set of other levels, while maintaining a difference between the levels unchanged.

(Supplementary note 7) The RF signal generation device according to any of supplementary notes 1 to 6, further comprising:

a voltage distribution measuring unit that measures voltage frequency distribution of an input signal; and a quantization noise control unit that controls the RF signal generation unit, on the basis of a measurement result of the voltage distribution measuring unit, such that an output level coincides with the voltage of high frequency of appearance.

(Supplementary note 8) The RF signal generation device according to any of supplementary notes 1 to 6, wherein the RF signal generation unit includes a comparator that compares a signal based on an input signal with a threshold voltage to determine an output level, the RF signal generation device further comprising:

a voltage distribution measurement unit that measures quantization noise in the vicinity of a desired frequency band in an output signal from the digital amplifier; and a quantization noise control unit that adjusts the threshold voltage, on the basis of a measurement result of the voltage distribution measurement unit, such that the quantization noise becomes smaller.

(Supplementary note 9) A radio transmitter comprising:

the RF signal generation device generating an RF signal according to any one of claims 1 to 8, and an antenna that transmits the generated RF signal.

(Supplementary note 10) An RF signal generation method comprising:

pulse-modulating a prescribed signal to generate an output signal in which four or more-level discrete output levels appear and a lowest level and any other level appear alternately;

converting the pulse-modulated signal into an RF signal in which a smaller number of levels than the number of levels in the output signal;

converting the RF signal into a binary signal comprising plural bits in which bits corresponding to signal levels in the RF signal are significant;

amplifying the binary signal comprising plural bits to a signal having a voltage corresponding to the levels in the RF signal; and passing a desired frequency band out of the signal having the amplified voltage to generate an analog RF signal.

(Supplementary note 11) The RF signal generation method according to supplementary note 10, further comprising, when pulse-modulating, generating a pulse phase signal having a pulse waveform shape on the basis of a phase signal of a baseband signal, multi-leveling an amplitude signal of the baseband signal to four or more levels by delta-sigma modulation in synchronization with the pulse phase signal, and multiplying the multi-leveled signal by the pulse phase signal.

(Supplementary note 12) The RF signal generation method according to supplementary note 11, wherein, when multi-leveling to four or more levels, a multi-level signal comprising one or more sets of output levels $V_k$, $V_k'$, and $V_k''$ satisfying the following expression is outputted, under the condition that $V_{min}$ is a minimum output level.

$$V_k - V_{min} = V_k'' - V_k'$$

(Supplementary note 13) The RF signal generation method according to supplementary note 11 or 12, wherein, when multi-leveling to four or more levels, a multi-level signal comprising one or more sets of output levels $V_k$ and $V_k'$ satisfying the following expression is outputted, under the condition that $V_{min}$ is a minimum output level and $V_{max}$ is a maximum output level.

$$V_k - V_{min} = V_{max} - V_k'$$

(Supplementary note 14) The RF signal generation method according to any of supplementary notes 10 to 13, wherein, when multi-leveling to four or more levels, a voltage having output levels that is in a linear relationship with levels in the RF signal outputted from the code converter is outputted.

(Supplementary note 15) The RF signal generation method according to any of supplementary notes 10 to 14, wherein a set of the lowest level and another level in the RF signal are converted into a set of other levels, while maintaining a difference between the levels unchanged.

(Supplementary note 16) The RF signal generation method according to any of supplementary notes 10 to 15, further comprising:

measuring v voltage frequency distribution of an input signal; and controlling the pulse-modulation, on the basis of a measurement result of the voltage distribution measuring unit, such that an output level coincides with the voltage of high frequency of appearance.

(Supplementary note 17) The RF signal generation method according to any of supplementary notes 10 to 15, wherein, when pulse-modulating, an output level is determined by comparing a signal based on an input signal with a threshold voltage;

further comprising:

measuring quantization noise in the vicinity of a desired frequency band in a signal of a voltage corresponding to the levels in the RF signal; and adjusting the threshold voltage, on the basis of a measurement result, such that the quantization noise becomes smaller.

It should be noted that the present invention is not limited to the above-described exemplary embodiments, and can be modified as appropriate within the range not departing from the gist. Further, the present invention may be implemented by combining the exemplary embodiments as appropriate.

REFERENCE SIGNS LIST 1 digital baseband unit
3 pulse phase signal generator
4 multiplier
6a, 6b, 6c, 6d driver amplifier
7a, 7b, 7c, 7d switch element (amplifying element)
8 filter circuit
9 amplitude and phase detector
10 voltage distribution calculation unit
11 quantization noise control unit
12 voltage distribution measurement unit
22 four-level delta-sigma modulator
23 five-level delta-sigma modulator
24 five-level delta-sigma modulator
25 six-level delta-sigma modulator
26 N-level delta-sigma modulator
53, 54, 55, 56, 57 decoder
91, 92, 93, 94, 95 code converter
100 RF signal generation device
110 antenna
102, 103, 104, 105, 106, 107, 108 RF signal generation unit
203, 204, 205, 206, 207 driver unit
303, 304, 305, 306, 307 class-D amplifier (digital amplifier)

The invention claimed is:

1. A radio frequency (RF) signal generation device comprising:
   an RF signal generation unit that pulse-modulates a prescribed signal to generate an output signal in which four or more-level discrete output levels appear and a lowest level and any other level appear alternately;
   a code converter that converts the output signal from the RF signal generation unit into an RF signal in which a smaller number of levels than the number of levels in the output signal;
   a driver unit that converts the RF signal from the code converter into a binary signal comprising plural bits in which bits corresponding to signal levels in the RF signal are significant; and
   a digital amplifier that outputs a voltage corresponding to levels in the RF signal outputted from the code converter, on the basis of an output signal from the driver unit.

2. The RF signal generation device according to claim 1, wherein the RF signal generation unit includes
   a pulse phase signal generator that generates a pulse phase signal having a pulse waveform shape on the basis of a phase signal of a baseband signal,
   a delta-sigma modulator that multi-levels an amplitude signal of the baseband signal to four or more levels by delta-sigma modulation in synchronization with the pulse phase signal, and
   a multiplier that multiplies an output signal from the delta-sigma modulator by the pulse phase signal.

3. The RF signal generation device according to claim 2, wherein the delta-sigma modulator outputs a multi-level signal comprising one or more sets of output levels $V_k$, $V_k'$, and $V_k''$ satisfying an expression (1), under the condition that $V_{min}$ is a minimum output level.

$$V_k - V_{min} = V_k'' - V_k' \tag{1}$$

4. The RF signal generation device according to claim 2, wherein the delta-sigma modulator outputs a multi-level signal comprising one or more sets of output levels $V_k$ and $V_k'$ satisfying an expression (2), under the condition that $V_{min}$ is a minimum output level and $V_{max}$ is a maximum output level.

$$V_k - V_{min} = V_{max} - V_k' \tag{2}$$

5. The RF signal generation device according to claim 2, wherein the digital amplifier outputs a voltage having output levels that is in a linear relationship with levels in the RF signal outputted from the code converter.

6. The RF signal generation device according to claim 1, wherein the code converter converts a set of the lowest level and another level into a set of other levels, while maintaining a difference between the levels unchanged.

7. The RF signal generation device according to claim 1, further comprising:
a voltage distribution measuring unit that measures voltage frequency distribution of an input signal; and
a quantization noise control unit that controls the RF signal generation unit, on the basis of a measurement result of the voltage distribution measuring unit, such that an output level coincides with the voltage of high frequency of appearance.

8. The RF signal generation device according to claim 1, wherein the RF signal generation unit includes a comparator that compares a signal based on an input signal with a threshold voltage to determine an output level,
the RF signal generation device further comprising:
a voltage distribution measurement unit that measures quantization noise in the vicinity of a desired frequency band in an output signal from the digital amplifier; and
a quantization noise control unit that adjusts the threshold voltage, on the basis of a measurement result of the voltage distribution measurement unit, such that the quantization noise becomes smaller.

9. A radio transmitter comprising:
the RF signal generation device generating an RF signal according to claim 1, and
an antenna that transmits the generated RF signal.

10. A radio frequency (RF) signal generation method comprising:
pulse-modulating a prescribed signal to generate an output signal in which four or more-level discrete output levels appear and a lowest level and any other level appear alternately;
converting the pulse-modulated signal into an RF signal in which a smaller number of levels than the number of levels in the output signal;
converting the RF signal into a binary signal comprising plural bits in which bits corresponding to signal levels in the RF signal are significant;
amplifying the binary signal comprising plural bits to a signal having a voltage corresponding to the levels in the RF signal; and
passing a desired frequency band out of the signal having the amplified voltage to generate an analog RF signal.

11. The RF signal generation method according to claim 10, further comprising, when pulse-modulating,
generating a pulse phase signal having a pulse waveform shape on the basis of a phase signal of a baseband signal,
multi-leveling an amplitude signal of the baseband signal to four or more levels by delta-sigma modulation in synchronization with the pulse phase signal, and
multiplying the multi-leveled signal by the pulse phase signal.

12. The RF signal generation method according to claim 11, wherein, when multi-leveling to four or more levels,
a multi-level signal comprising one or more sets of output levels $V_k$, $V_k'$, and $V_k''$ satisfying the following expression is outputted, under the condition that $V_{min}$ is a minimum output level.

$$V_k - V_{min} = V_k'' - V_k'$$

13. The RF signal generation method according to claim 11, wherein, when multi-leveling to four or more levels,
a multi-level signal comprising one or more sets of output levels $V_k$ and $V_k'$ satisfying the following expression is outputted, under the condition that $V_{min}$ is a minimum output level and $V_{max}$ is a maximum output level.

$$V_k - V_{min} = V_{max} - V_k'$$

14. The RF signal generation method according to claim 11, wherein, when multi-leveling to four or more levels,
a voltage having output levels that is in a linear relationship with levels in the RF signal outputted from the code converter is outputted.

15. The RF signal generation method according to claim 10, wherein a set of the lowest level and another level in the RF signal are converted into a set of other levels, while maintaining a difference between the levels unchanged.

16. The RF signal generation method according to claim 10, further comprising:
measuring v voltage frequency distribution of an input signal; and
controlling the pulse-modulation, on the basis of a measurement result, such that an output level coincides with the voltage of high frequency of appearance.

17. The RF signal generation method according to claim 10, wherein, when pulse-modulating, an output level is determined by comparing a signal based on an input signal with a threshold voltage;
the RF signal generation method further comprising:
measuring quantization noise in the vicinity of a desired frequency band in a signal of a voltage corresponding to the levels in the RF signal; and
adjusting the threshold voltage, on the basis of a measurement result, such that the quantization noise becomes smaller.

* * * * *